United States Patent
Gieskes

(10) Patent No.: US 11,044,814 B2
(45) Date of Patent: Jun. 22, 2021

(54) METHOD OF ASSEMBLY

(71) Applicant: Universal Instruments Corporation, Conklin, NY (US)

(72) Inventor: Koenraad Alexander Gieskes, Deposit, NY (US)

(73) Assignee: UNIVERSAL INSTRUMENTS CORPORATION, Conklin, NY (US)

(*) Notice: Subject to any disclaimer, the term of this patent is extended or adjusted under 35 U.S.C. 154(b) by 115 days.

(21) Appl. No.: 16/309,955

(22) PCT Filed: Jun. 21, 2016

(86) PCT No.: PCT/US2016/038455
§ 371 (c)(1),
(2) Date: Dec. 14, 2018

(87) PCT Pub. No.: WO2017/222502
PCT Pub. Date: Dec. 28, 2017

(65) Prior Publication Data
US 2019/0166697 A1    May 30, 2019

(51) Int. Cl.
*H01S 4/00*    (2006.01)
*H05K 1/18*    (2006.01)
(Continued)

(52) U.S. Cl.
CPC ......... *H05K 1/189* (2013.01); *H05K 13/0406* (2018.08); *H05K 1/118* (2013.01); *H05K 2201/058* (2013.01)

(58) Field of Classification Search
CPC .. H05K 1/118; H05K 1/189; H05K 2201/058; H05K 13/0406
See application file for complete search history.

(56) References Cited

U.S. PATENT DOCUMENTS 3,853,379 A    12/1974    Goodman et al.
4,563,683 A    1/1986    Tanaka et al.
(Continued)

FOREIGN PATENT DOCUMENTS

CN    1319067 A    10/2001
CN    104103991 A    10/2014
(Continued)

OTHER PUBLICATIONS

Office Action and Search Report (dated Nov. 27, 2019) for Swedish Patent Application No. 1950029-7—Filing Date: Jun. 21, 2016. 2 pages.

(Continued)

*Primary Examiner* — Paul D Kim

(74) *Attorney, Agent, or Firm* — Schmeiser, Olsen & Watts, LLP

(57) ABSTRACT

A slip track includes a continuous circuitous track. The continuous circuitous track includes a layered printed circuit board. The layered printed circuit board includes a top track layer configured to supply electric power to a device having a contact element sliding across the top track layer, the layered printed circuit board further having a lower layer connected to the top track layer, the lower layer configured to supply electric power to the top track layer. The layered printed circuit board is flexible and is bent around curves in the continuous circuitous track. A method of assembly using the slip track is further disclosed.

11 Claims, 6 Drawing Sheets

(51) Int. Cl.
*H05K 13/04* (2006.01)
*H05K 1/11* (2006.01)

(56) References Cited

U.S. PATENT DOCUMENTS

| | | | |
|---|---|---|---|
| 5,065,284 | A | 11/1991 | Hernandez |
| 5,297,484 | A | 3/1994 | Piserchia et al. |
| 5,484,294 | A | 1/1996 | Sobhani |
| 5,568,192 | A | 10/1996 | Hannah |
| 5,690,498 | A | 11/1997 | Sobhani |
| 5,782,186 | A | 7/1998 | McTaggart |
| 5,891,606 | A | 4/1999 | Brown |
| 5,901,429 | A | 5/1999 | Crockett |
| 6,356,002 | B1 | 3/2002 | Witherspoon et al. |
| 6,392,693 | B1 | 5/2002 | Wakiyama et al. |
| 6,502,298 | B1 | 1/2003 | Witherspoon et al. |
| 6,760,644 | B2 | 7/2004 | Canaday et al. |
| 6,798,612 | B2 | 9/2004 | Smith et al. |
| 6,810,306 | B1 | 10/2004 | Ostwald |
| 6,885,911 | B1 | 4/2005 | Smith |
| 6,930,855 | B2 | 8/2005 | Gupta et al. |
| 6,984,915 | B2 | 1/2006 | Galyean |
| 7,142,071 | B2 | 1/2006 | Coleman |
| 7,105,983 | B2 | 9/2006 | Day et al. |
| 7,184,238 | B1 | 2/2007 | Ostwald et al. |
| 7,339,302 | B2 | 3/2008 | Lewis et al. |
| 7,432,359 | B2 | 10/2008 | Kataoka et al. |
| 7,439,449 | B1 | 10/2008 | Kumar et al. |
| 7,495,366 | B2 | 2/2009 | Day et al. |
| 7,559,767 | B2 | 7/2009 | Coleman et al. |
| 7,597,565 | B1 | 10/2009 | Jorgensen |
| 8,011,995 | B1 | 9/2011 | Todd |
| 8,497,935 | B2 | 7/2013 | Swarr et al. |
| 8,651,711 | B2 | 2/2014 | Rudisill et al. |
| 9,490,600 | B2 * | 11/2016 | Holzapfel ............. H01R 39/08 |
| 2004/0169434 | A1 | 9/2004 | Washington et al. |
| 2007/0285949 | A1 | 12/2007 | Lodhei et al. |
| 2013/0143631 | A1 | 6/2013 | Platzer |
| 2014/0043027 | A1 | 2/2014 | Overweg |
| 2014/0111951 | A1 | 4/2014 | Standing et al. |
| 2015/0173204 | A1 | 6/2015 | Gieskes et al. |
| 2015/0173260 | A1 | 6/2015 | Gieskes et al. |
| 2015/0181779 | A1 | 6/2015 | Gieskes et al. |
| 2017/0214202 | A1 * | 7/2017 | Holzapfel ............. H01R 39/56 |

FOREIGN PATENT DOCUMENTS

| | | |
|---|---|---|
| CN | 104411608 A | 3/2015 |
| JP | 2015530929 A | 10/2015 |
| WO | 2017/222502 A1 | 12/2017 |

OTHER PUBLICATIONS

Office Action and Search Report—Notice (4 months) (dated Nov. 27, 2019) for Swedish Patent Application No. 1950029-7—Filing Date: Jun. 21, 2016. 7 pages.

Office Action in corresponding Japanese Patent Application No. 2018-566382, dated Jun. 2, 2020. 4 pages.

Application No. PCT/US2016/038455, International Search Report and the Written Opinion of the International Searching Authority, or the Declaration dated Sep. 7, 2016, 11 pages.

Office Action in corresponding Chinese Patent Application No. 201680086975.8 dated Feb. 3, 2021. 10 pages.

* cited by examiner

METHOD OF ASSEMBLY

BACKGROUND OF THE DISCLOSURE

This application claims priority to PCT Application No. PCT/US2016/038455, having a filing date of Jun. 21, 2016, entitled "Sliptrack Architecture for an Assembly Machine, System and Method," the disclosure of which are hereby incorporated by reference.

1. Technical Field

This invention relates generally to a slip track architecture. More particularly, the present invention relates to a slip track architecture that may be utilized for an assembly machine or system, and methods of use thereof.

2. Related Art

In present slip track systems a single moving brush unit slides over a metal track. The metal track may transfer current to the moving brush unit via brushes contained on the unit and connected to internal components of the moving brush unit. The metal track in these systems is often plated with a precious metal such as hard silver, or gold, to provide minimal electrical resistance and to resist corrosion. The metal track of existing systems has a cross section surface area that is typically related to the maximum current that the moving brush unit is capable of drawing from the track. As such, the dimensions of the track limit the amount of current provided by a track to the moving brush unit. High current requirements may cause present slip track systems to be unfeasible in certain scenarios where a slip track system would be otherwise desirable.

Thus, an improved slip track architecture, system and method of use thereof that may be applicable to an assembly machine would be well received in the art.

BRIEF DESCRIPTION OF THE DISCLOSURE

According to one aspect, a slip track comprises: a continuous circuitous track including a layered printed circuit board, wherein the layered printed circuit board includes a top track layer configured to supply electric power to a device having a contact element sliding across the top track layer, the layered printed circuit board further having a lower layer connected to the top track layer, the lower layer configured to supply electric power to the top track layer, wherein the layered printed circuit board is flexible and is bent around curves in the continuous circuitous track.

According to another aspect, an assembly machine comprises: a plurality of dispensing heads configured to at least partially assemble an unfinished product, the plurality of dispensing heads each including a contact element; and a track configured to supply electric power to the dispensing head when the contact element contacts the track as the dispensing head moves along the track, wherein the track includes a layered printed circuit board having a top track layer configured to supply electric power to the dispensing head and a lower layer connected to the top track layer, the lower layer configured to supply electric power to the top track layer, wherein the track is circuitous and includes curves, and wherein the layered printed circuit board is flexible and is bent around the curves in track.

According to another aspect, a method of assembly comprises: printing a layered circuit board having a top track layer and a lower layer under the top track layer; supplying electrical power to the top track layer with the lower layer; providing a dispensing head with a contact element; moving the dispensing head along the top track layer while the contact element contacts the top track layer; supplying power to the dispensing head with the top track layer; and bending the layered circuit board to create a circuitous track from the layered circuit board.

BRIEF DESCRIPTION OF THE DRAWINGS

Some embodiments of this invention will be described in detail, with reference to the following figures, wherein like designations denote like members, wherein.

DETAILED DESCRIPTION OF THE INVENTION

A detailed description of the hereinafter described embodiments of the disclosed apparatus and method are presented herein by way of exemplification and not limitation with reference to the Figures.

Figure 1:
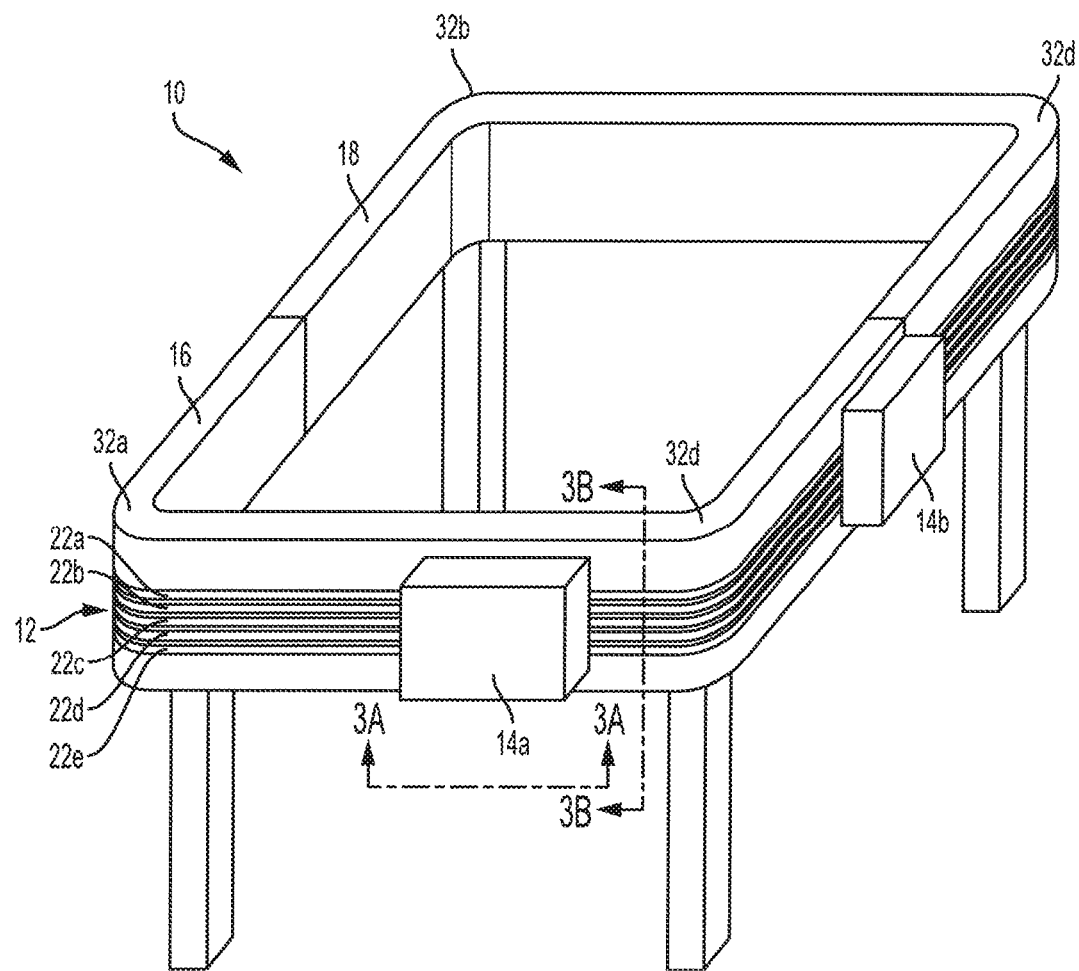
FIG. 1 depicts a perspective view of an assembly machine according to one embodiment.

Referring to FIG. 1, an assembly machine 10 is shown in accordance with one embodiment. The assembly machine 10 may include some or all of the features and functionality described in the assembly machines 10, 100, 200, 300, 400, 500 of PCT Application Nos. PCT/US2013/048196 and PCT/US15/14996, the disclosures of which are hereby incorporated by reference to the extent that it is not inconsistent with the present disclosure. The assembly machine 10 is shown including a housing that is supported by a plurality of legs. The assembly machine 10 includes a slip track 12 disposed on the housing. One or more dispensing heads 14a, 14b may be configured to move along the slip track 12, which may create a complete circuit in the manner shown in FIG. 1. The dispensing heads 14a, 14b may be, for example, configured to pick up electronic components at a picking location (not shown), may be configured to dispense a substance such as an adhesive, or may be configured to otherwise interact with an unfinished product (e.g. by screwing a screw into an unfinished product). The picking location may be attached to or otherwise located proximate the assembly machine 10. The dispensing heads 14a, 14b may further be configured to place electronic components at a placement location (not shown) such as where a board handling system provides an axis perpendicular to the slip track 12.

The dispensing heads 14a, 14b may be attached magnetically or mechanically to the slip track 12 such that the dispensing heads 14a, 14b are movable along the slip track 12 in an independent manner. It should be understood that the slip track 12 and the assembly machine 10 may be configured to receive additional dispensing heads 14a, 14b not shown. Furthermore, the assembly machine 10 may be modular in design. In the embodiment shown, the assembly machine 10 includes a first modular section 16 and a second modular section 18. However, other embodiments may be larger and may have additional middle sections. The assembly machine 10 may thus be expanded in a modular manner as necessary as taught by the applications incorporated by reference.

Thus, the slip track 12 may include a plurality of connected modular track sections. In one embodiment, the track sections 12 may be smaller than the entirety of the modular sections 16, 18 of the assembly machine 10. For example, each of the modular sections 16, 18 may include a plurality of the track sections 12. Each of the track sections 12 (one being shown in FIG. 4) may be created in standard lengths so that they can be applied, attached, screwed, mounted or otherwise connected to a modular section 16, 18 of the assembly machine 10 or a non-modular assembly machine (not shown).

Figure 2:
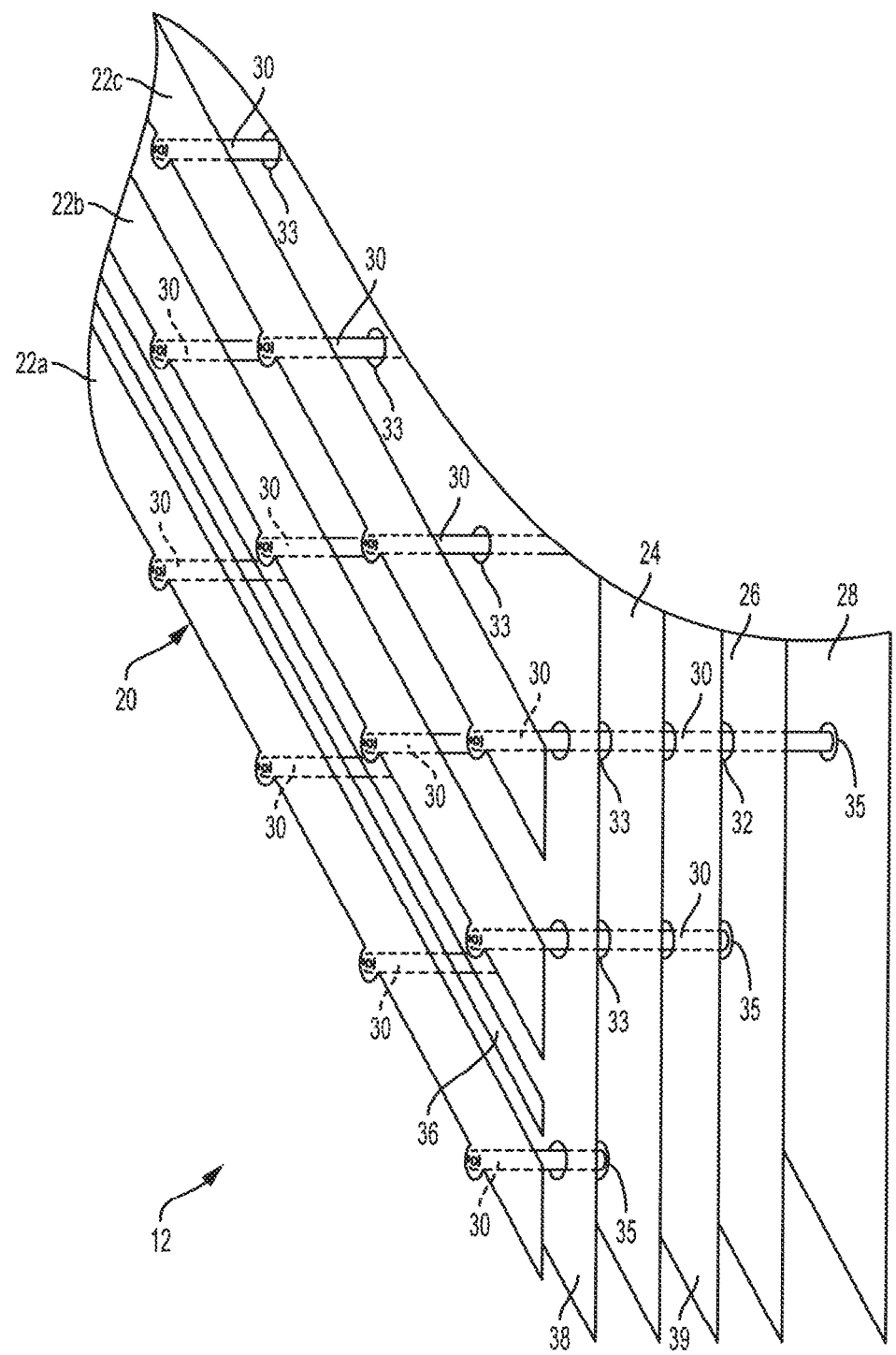
FIG. 2 depicts an exploded view of a slip track architecture according to one embodiment.
Figure 4:
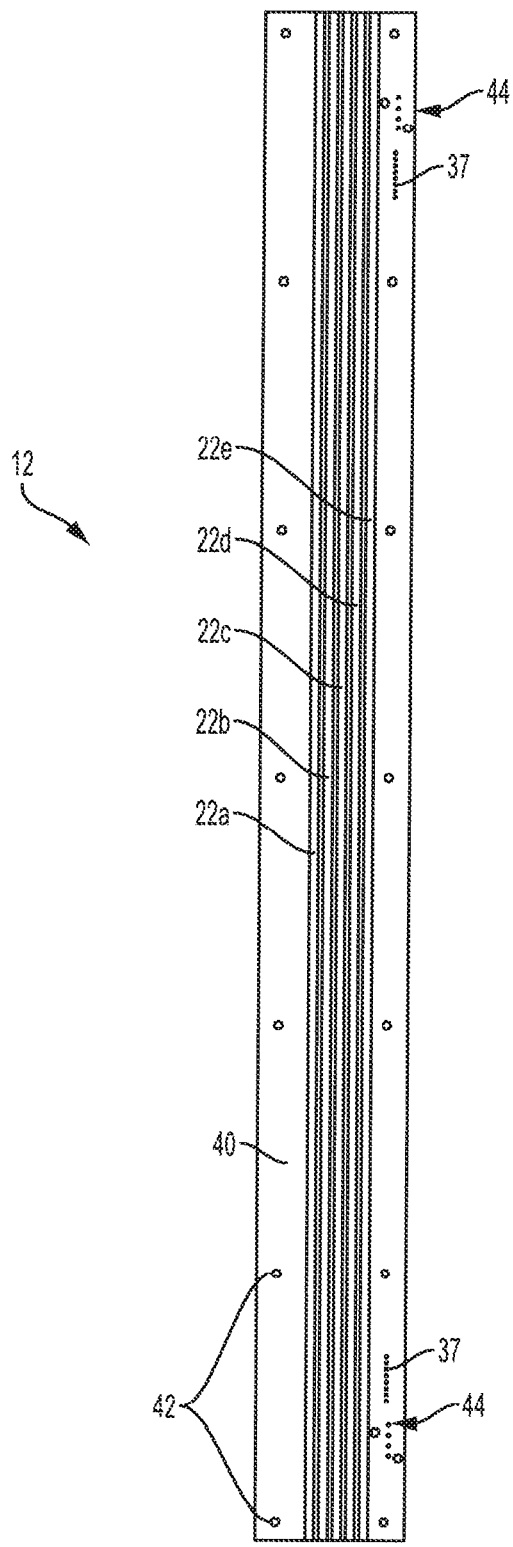
FIG. 4 depicts a top view of a section of a slip track of the assembly machine of FIG. 1 in accordance with one embodiment.

Referring now to FIG. 2, an exploded view of a portion of the slip track 12 is shown in the same orientation shown in FIG. 1. The slip track 12 may be a layered printed circuit board having a top track layer 20. The slip track 12 may be a continuous circuitous track (as shown in FIG. 1) where the layered printed circuit board is disposed along an entirety of the continuous circuitous track. The continuous circuitous track may include sections or lengths that may enable the modularity of the system. An exemplary section of the track 12 is shown in FIG. 4. The top track layer 20 includes a first track 22a, a second track 22b, and a third track 22c, a fourth track 22d (shown in FIGS. 1 and 4) and a fifth track 22e (shown in FIGS. 1 and 4). Five tracks 22a, 22b, 22c, 22d, 22e are shown for exemplary purposes and there may be more or less than five tracks depending on the embodiment. The tracks 22a, 22b, 22c, 22d, 22e may each be configured to provide electric power or current to a device, such as the dispensing heads 14a, 14b, sliding across the respective tracks 22a, 22b, 22c, 22d, 22e. In addition to providing electrical power or current to the dispensing heads 14a, 14b, the tracks 22a, 22b, 22c, 22d, 22e may be configured to provide a bus communication or signal to the dispensing heads 14a, 14b as described further herein below.

A first lower layer 24 is located directly under the top track layer 20. A second lower layer 26 is located under the first lower layer 24, and a third lower layer 28 is under the second lower layer 26. It should be understood that the layered printed circuit board may include any number of layers. In one embodiment, the number of layers is at least equal to or greater than the number of tracks 22a, 22b, 22c, 22d, 22e that are incorporated into the slip track 12. Thus, while three lower layers 24, 26, 28 are shown, the embodiment shown in FIG. 1 may include at least five lower layers corresponding to the five tracks shown.

Each lower layer 24, 26, 28 may be operably connected to one of the tracks 22a, 22b, 22c, 22d, 22e with connections 30. The connections 30 may be elements that electrically connect the tracks 22a, 22b, 22c, 22d, 22e, with one or more of the lower layers 24, 26, 28. The connections 30 are shown attached to an edge of each track 22a, 22b, 22c, 22d, 22e, and extending to one or more of the layers 24, 26, 28 below. The connections may be precisely spaced along the tracks 22a, 22b, 22c, 22d, 22e at regular intervals and may carry current from the lower layers 24, 26, 28 to the tracks 22a, 22b, 22c, 22d, 22e above. The connections 30 are configured to bypass layers and may connect to individual layers or tracks using three-dimensional capabilities of a printed circuit board.

The connections 30 are shown in FIG. 2 to be elongated for illustrative purposes, but it should be understood that the entirety of the combined layers 20, 24, 26, 28 of the track may be extremely thin such that the track is bendable or flexible. Thus, the connections may only extend a distance sufficient to connect the tracks 22a, 22b, 22c, 22d, 22e to the appropriate layers 24, 26, 28 below. The bendable or flexible nature of the slip track 12 may allow the slip track 12 to bend around corners 32a, 32b, 32c, 32d (shown in FIG. 1) to create an appropriate radius and circuit. In other embodiments, the slip track 12 may be disposed horizontally (rather than vertically as shown) in an athletic track arrangement. Such a horizontally disposed or flat athletic track may be fabricated using printed circuit board technology.

The lower layers 24, 26, 28 may each include a plurality of through holes 33 through which the connections 30 may extend. These through holes 33 may allow the lower layers 24, 26, 28 to be electrically connected to the top track layer 20. It should be understood that these through holes 33 may allow the connections 30 to bypass one or more of the lower layers 24, 26, 28 and connect individual tracks 22a, 22b, 22c, 22d, 22e to specific individual lower layers 24, 26, 28. The connections 30 may connect to each of the layers 24, 26, 28 at connecting points 35. At these connecting points 35, the connections 30 are actually attached to a respective layer and do not extend therethrough.

In one embodiment, the lower layers 24, 26, 28 may each be made of copper or another current-carrying conductive material. The lower layers 24, 26, 28 may each be attached to a single track 22a, 22b, 22c, 22d, 22e. In one embodiment one or more layers may be made of brass instead of copper. For example, the lowest layer may be made of brass for the mechanical properties associated with brass and attaching the layer to the assembly machine 10.

The first lower track layer 24 may be attached and carry current to the first track 22a, the second lower track layer 26 may be attached and carry current to the second track 22b, and the third lower track 22c may be attached and carry current to the third track 22c. Thus, the lower layers 24, 26, 28 may be dedicated layers which provide current to a single of the tracks 22a, 22b, 22c, 22d, 22e at the top track layer 20. Similarly, the tracks 22a, 22b, 22c, 22d, 22e may be made of copper as well. In the embodiment shown in FIG. 1, five tracks may exist, each having their own separate individual lower layer.

Utilizing printed circuit board technology into the slip track 12 may allow the slip track 12 to integrate electrical components such as capacitors, inductors, connectors and the like. As shown in FIG. 4, each section of the track 12 may include one or more inductors, capacitors, or electronic components 37 connected or integrated into at least one of the individual tracks 22a, 22b, 22c, 22d, 22e and the lower layers 24, 26, 28. These inductors, capacitors or other electronic components 37 may provide spark prevention and improve signals between the individual tracks 22a, 22b, 22c, 22d, 22e, and the dispensing heads 14a, 14b and otherwise reduce electrical noise between the top track layer 20, the dispensing heads 14a, 14b, and the lower track layers 24, 26, 28. The inductors, capacitors or other electronic components 37 may be integrated, connected, inserted or surface mounted on the back or front of the track 12.

Figure 3A:
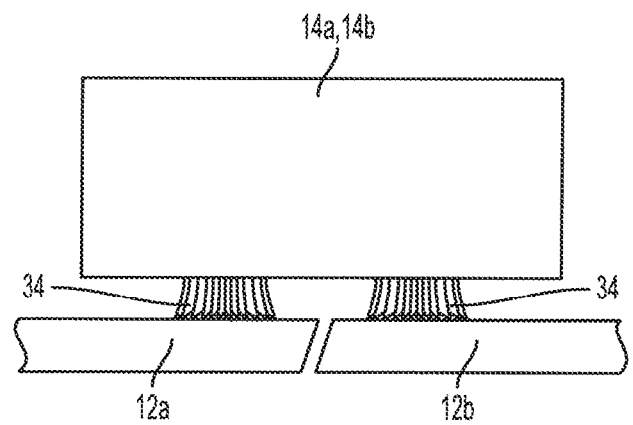
FIG. 3A depicts a bottom view of a moving brush unit taken at arrows 3A-3A in FIG. 1, in accordance with one embodiment.
Figure 3B:
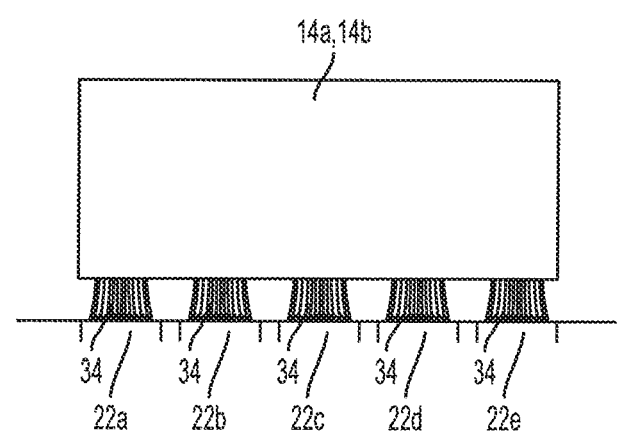
FIG. 3B depicts a side view of the moving brush unit of FIG. 3, taken at arrows 3B-3B in FIG. 1, in accordance with one embodiment.

Referring now to FIGS. 3A and 3B, one of the dispensing heads 14a, 14b is shown. While the dispensing head 14a, 14b is described as a dispensing head herein, it should be understood that the disclosure is not limited to a dispensing head and that any type of appropriate device may be configured to travel around the slip track 12. This traveling may be accomplished by traveling in circuitous rotations or revolutions about the track. The dispensing head 14a, 14b is shown including a plurality of contact elements 34. These contact elements 34 may be metallic brushes that may be configured to move or slide over the tracks 22a, 22b, 22c, 22d, 22e, etc. In one embodiment, the brushes may be comprised of a graphite material. Other metals are contemplated and might be appropriate depending on the efficiency and cost. Other embodiments may not be brushes, but may be metallic wheels, or the like. In any event, the contact elements may be configured to move across the slip track 12, and more particularly the individual tracks 22a, 22b, 22c, 22d, 22e, in order to allow the transfer of electric energy between the tracks 22a, 22b, 22c, 22d, 22e and the dispensing head 14a, 14b.

FIG. 3A shows a bottom view of the dispensing head 14a, 14b taken at arrows 3A-3A from FIG. 1, moving in the direction D1. FIG. 3A shows that the dispensing head 14a, 14b is moving over two sections of track 12a, 12b. These two sections of track 12a, 12b may represent the intersection of two lengths of the track 12, as shown in FIG. 4, or may further represent where each of the first and second modular sections 16, 18 meet. Two contact elements 34 may exist sliding over a single track in order to ensure that at least one contact element 34 is fully in contact with a track at all times. It should be understood that more or less than two contact elements 34 per dispensing head may be dedicated to each individual track 22a, 22b, 22c, 22d, 22e, etc., depending on the embodiment. In one embodiment, a single contact element may extend across the dispensing head 14a, 14b parallel to the tracks 22a, 22b, 22c, 22d, 22e. FIG. 3B shows a side view of the dispensing head 14a, 14b taken at arrows 3B, 3B of FIG. 1. FIG. 3B shows that each of the individual tracks 22a, 22b, 22c, 22d, 22e from FIG. 5 may include at least one dedicated contact element 34.

Each of the first track 22a, the second track 22b, and the third track 22c, etc. may be supplied power by their respective lower layers 24, 26, 28, etc. The voltage of each of these tracks 22a, 22b, 22c, 22d, 22e may be different. Thus, the first track 22a may supply a first voltage, the second track 22b may supply a second voltage and the third track 22c may supply a third voltage to the respective contact elements 34 and the dispensing heads 14a, 14b. These separate voltages may be configured to operate different functionality of the dispensing heads 14a, 14b. In one embodiment, a track may supply control signals to the dispensing heads 14a, 14b.

For example, one track may carry 380V DC for powering the dispensing heads 14a, 14b. One track may provide 48V DC for keeping certain functionality operable in the event that the 380V track is powered off. One track may provide 24V DC for a safety system carrying a safety signal associated with the dispensing heads 14a, 14b and the slip track 12. Still further, another track may be a 5V data or control signal transmitting track for sending a bus communication signal to the dispensing heads 14a, 14b. It should be understood that various other combinations of tracks and voltages are contemplated.

Located between the first track 22a, and the second track 22b is a ground track 36. This ground track 36 may be created, located or disposed between the power carrying layers to improve electrical separation of the different tracks. For example, the ground track 36 may be located between the highest voltage track and the adjacent track. Alternatively, ground layers may be located between a signal carrying track and a power higher voltage track to retain signal integrity in the signal carrying track. Still further, one or more ground layers 38, 39 may be provided between one or more of the lower layers 24, 26, 28 and/or the tracks 22a, 22b, 22c, 22d, 22e as well. In other embodiments, one or more ground layers may separate some or all of each of the current carrying lower layers 24, 26, 28. It should be understood that each of the lower layers 24, 26, 28 included may include one or more insulation layers surrounding, or located above and/or below the conductive material.

The slip track 12 may be applied to the structure of the assembly machine 10 by an adhesive such as a pressure sensitive adhesive. This may allow for the slip track 12 to be applied directly to the mechanical structure of the assembly machine 10. Still further, as shown in FIG. 4, the slip track 12 may further be applied using screws or bolts 42 located at regular intervals along each section of the slip track 12.

A section 40 of the slip track 12 is shown in FIG. 4 in accordance with one embodiment. The slip track 12 may thus be created as the straight section 40 of printed circuit board track as shown. Each of the sections 40 of the slip track 12 may be manufactured in segments for application on the assembly machine 10. Each of the sections 40 of the slip track 12 may include its own electrical connections 44 at the beginning and end of each of the sections 40. The electrical power may be supplied through the assembly machine 10 through the back of the slip track 12.

Figure 5:
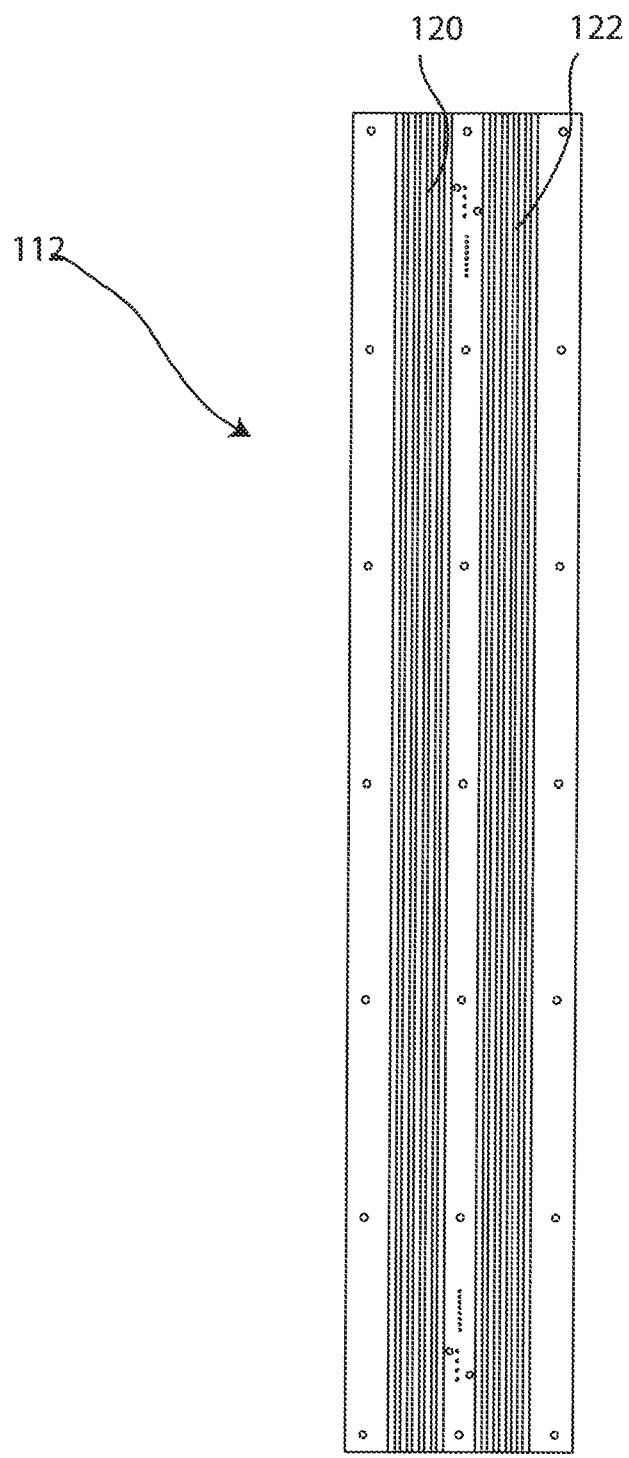
FIG. 5 depicts a top view of a section of another slip track in accordance with one embodiment.

Shown in FIG. 5 is another embodiment of a slip track 112. The slip track 112 shown in this embodiment includes a first track 120 and a second track 122, each comprised of five individual tracks similar or the same as the tracks 22a, 22b, 22c, 22d, 22e described hereinabove. The embodiment shows that any number of tracks is contemplated. Further, the system may include two or more separate and independent tracks 120, 122 upon which the dispensing heads 14a, 14b may travel on a continuous circuitous way around the modular system. Thus, one or more dispensing heads 14a, 14b may be located on the top track 120 while one or more of the dispensing heads 14a, 14b may be located on the bottom track 120. The dispensing heads 14a, 14b may be dimensioned such that there is clearance for the dispensing heads 14a, 14b on the top track 120 to pass the dispensing heads 14a, 14b on the lower track 122, and vice versa, without contact. Alternatively, it may be desirable for a dispensing heads 14a, 14b to be connected to each of the ten tracks shown in this embodiment.

Figure 6:
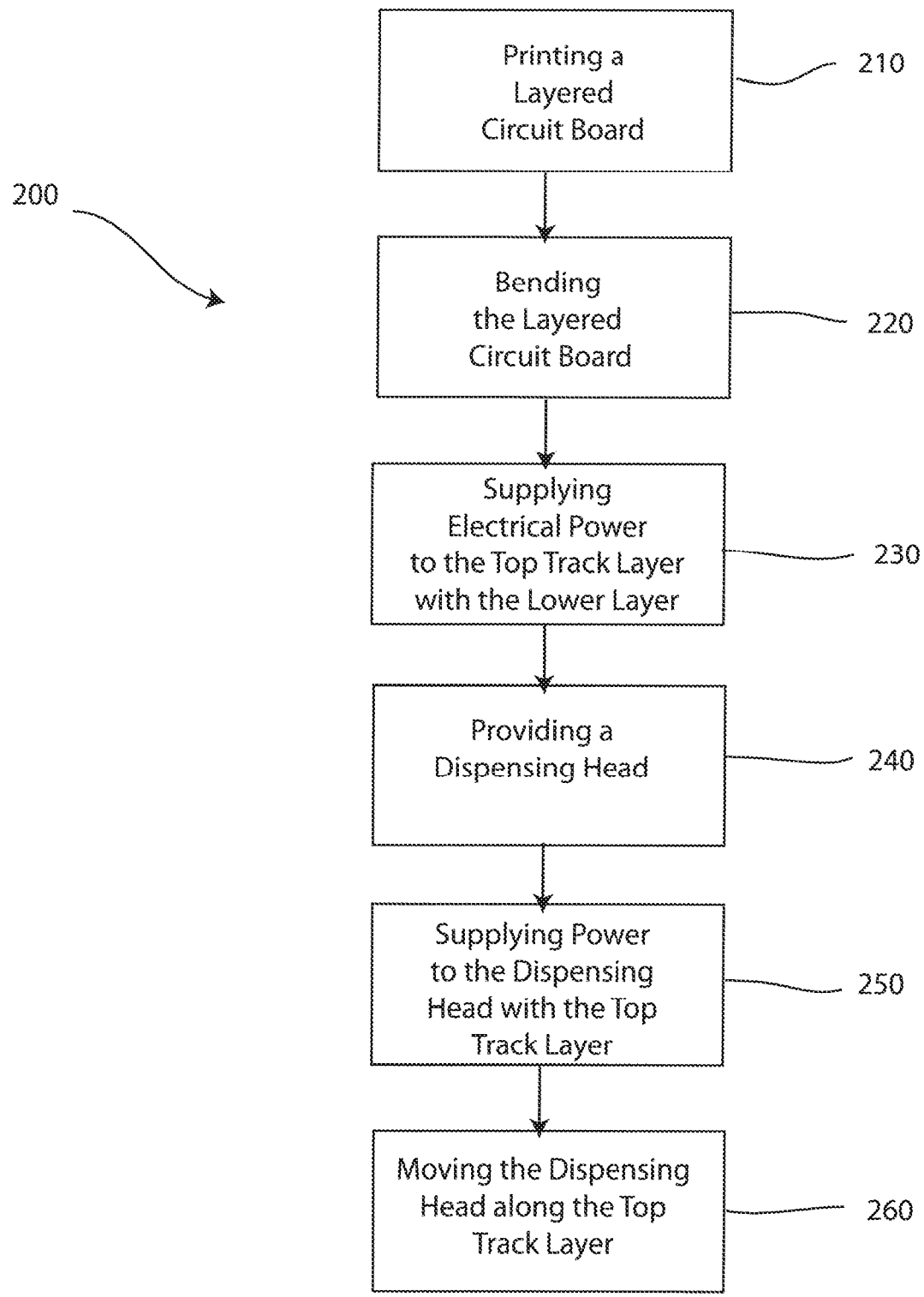
FIG. 6 depicts a flow chart of a method of assembly according to one embodiment.

Still further, as shown in FIG. 6 a method of assembly 200 may be provided. The method may include a first step 210 of printing a layered circuit board, such as the slip track 12, having a top track layer, such as the top track layer 20, and a lower layer, such as one of the lower layers 24, 26, 28, under the top track layer. The method may include a second step 220 of bending the layered circuit board to create a circuitous track from the layered circuit board. The method may include another step 230 of supplying electrical power to the top track layer with the lower layer. This step may include supplying power to a first track, such as the track 22a with a first lower layer, such as the lower layer 24, and supplying power to a second track, such as the track 22b, with a second lower layer, such as the lower layer 26. The method may further include a step 240 of providing a dispensing head, such as the dispensing heads 14a, 14b with a contact element, such as the contact elements 34. Another step 250 may include supplying power to the dispensing head with the top track layer, and more particularly with the first track and the second track. The method may include a step 260 of moving the dispensing head along the top track layer while the contact element contacts the top track layer.

The method may further providing a first track and a second track, and a first lower layer and a second lower layer. The method may include supplying power to the first track with the first lower layer, supplying power to the second track with the second lower layer, and supplying power to the dispensing head with each of the first track and the second track. The method may further include printing a plurality of the layered circuit boards in sections and attaching the sections to create the circuitous track. The method may also include supplying a bus communication to the dispensing head with at least one of the first track and the second track.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

I claim:

1. A method of assembly comprising:
   providing a layered circuit board having a top track layer and a lower layer under the top track layer, wherein the layered circuit board is configured to be bent to create a circuitous sliptrack;
   supplying a power to the top track layer with the lower layer;
   providing a dispensing head with a contact element configured to slide across the top track layer;
   moving the dispensing head along the top track layer while the contact element contacts the top track layer; and
   supplying the power to the moving dispensing head with the top track layer.

2. The method of assembly of claim 1, wherein the top track layer includes a first track and a second track, and wherein the lower layer includes a first lower layer and a second lower layer, the method further comprising:
   supplying the power to the first track with the first lower layer; and
   supplying the power to the second track with the second lower layer; and
   supplying the power to the dispensing head with each of the first track and the second track.

3. The method of assembly of claim 2, further comprising supplying a bus communication to the dispensing head with at least one of the first track and the second track.

4. The method of assembly of claim 2, wherein the layered circuit board further includes at least one ground track located between the first track and the second track.

5. The method of assembly of claim 1, further comprising creating the layered circuit board by attaching a plurality of layered circuit boards in sections to create the circuitous sliptrack.

6. The method of assembly of claim 1, further comprising receiving a plurality of devices by the circuitous sliptrack such that the plurality of devices travel around the circuitous sliptrack independently from each other, each of the plurality of devices having a respective device contact element configured to slide across the top track layer.

7. The method of assembly of claim 1, further comprising modularly adding a section of track to the circuitous sliptrack to expand a size of the circuitous sliptrack.

8. The method of assembly of claim 1, wherein the layered circuit board includes at least three lower layers.

9. The method of assembly of claim 8, wherein each of the at least three lower layers is dedicated to a separate track of the circuitous sliptrack.

10. The method of assembly of claim 1, further comprising assembling an unfinished product by the moving dispensing head.

11. The method of assembly of claim 1, wherein the circuitous sliptrack is mounted to a plurality of connected modular sections of an assembly machine.

* * * * *